[19] United States Patent
Holcomb et al.

[11] Patent Number: 5,306,705
[45] Date of Patent: Apr. 26, 1994

[54] SUPERCONDUCTOR-NORMAL-SUPERCONDUCTOR WITH DISTRIBUTED SHARVIN POINT CONTACTS

[75] Inventors: Matthew J. Holcomb, San Mateo County; William A. Little, Santa Clara County, both of Calif.

[73] Assignee: Board of Trustees of the Leland Stanford Junior University, Stanford, Calif.

[21] Appl. No.: 58,986

[22] Filed: May 6, 1993

Related U.S. Application Data

[63] Continuation of Ser. No. 732,049, Jul. 18, 1991, abandoned.

[51] Int. Cl.$^5$ .................. H01L 39/22; H01L 39/12
[52] U.S. Cl. .................. 505/191; 505/778; 505/780; 505/782; 505/783; 505/805; 505/817; 505/220; 505/236; 257/31; 257/32; 257/33; 257/35
[58] Field of Search .......... 357/5; 505/785, 805, 505/806, 813, 817, 821, 822; 257/31, 32, 33, 34, 35

[56] References Cited

U.S. PATENT DOCUMENTS

| 3,259,866 | 7/1966 | Miles et al. | 357/5 |
|---|---|---|---|
| 3,259,866 | 7/1966 | Miles et al. | 357/05 |
| 3,423,607 | 1/1969 | Kunzler | 257/31 |
| 3,573,661 | 4/1971 | McCumber | 307/277 |
| 4,660,061 | 4/1987 | Sweeny et al. | 357/5 |
| 4,962,086 | 10/1990 | Gallagher et al. | 505/701 |
| 4,966,142 | 10/1990 | Zimmerman et al. | 357/5 |

FOREIGN PATENT DOCUMENTS 63-266889 11/1988 Japan .................. 257/33

OTHER PUBLICATIONS

Weitz et al., "Characterization of Niobium Point Contacts Showing Josephson Effects in the Far Infrared", J. Appl. Phys., vol. 49, No. 9, Sep. 1978, pp. 4873–4880.
M. B. Bever, Encyclopedia of Materials Science and Engineering, vol. 6, R–S, 1986, pp. 4806–4808.

Primary Examiner—Andrew J. James
Assistant Examiner—Alice W. Tang
Attorney, Agent, or Firm—Flehr, Hohbach, Test, Albritton & Herbert

[57] ABSTRACT

A non-linear superconducting junction device comprising a layer of high transient temperature superconducting material which is superconducting at an operating temperature, a layer of metal in contact with the layer of high temperature superconducting material and which remains non-superconducting at the operating temperature, and a metal material which is superconducting at the operating temperature and which forms distributed Sharvin point contacts with the metal layer.

11 Claims, 3 Drawing Sheets

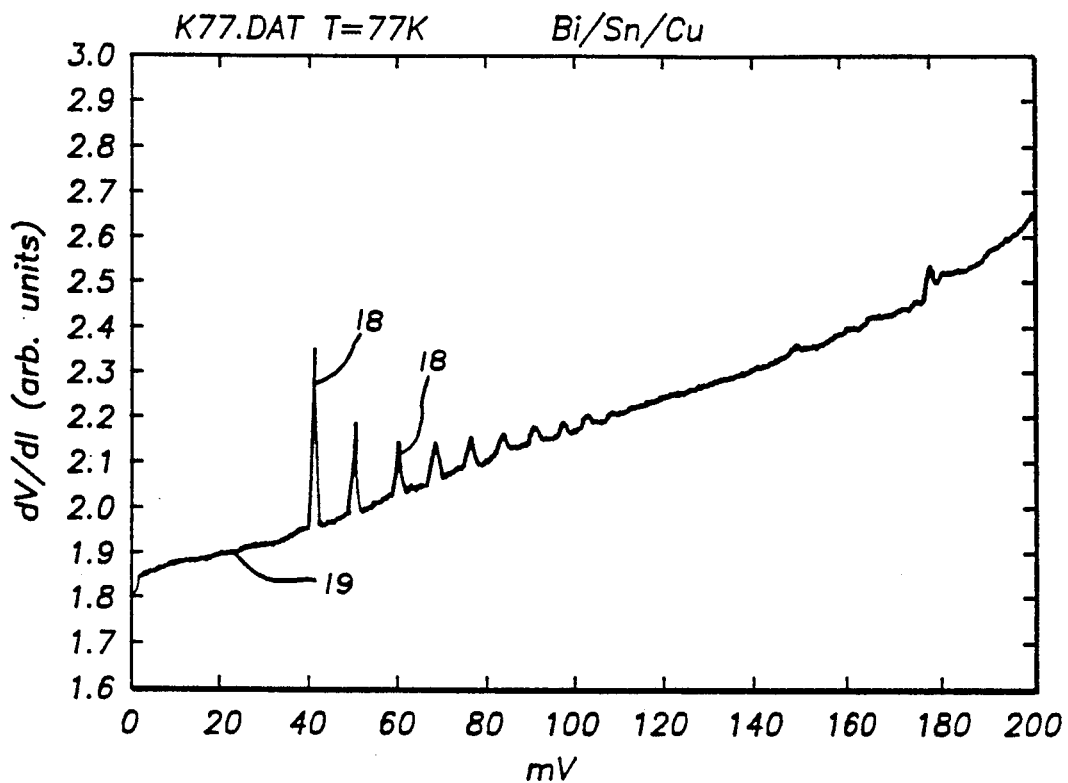
FIG.—4
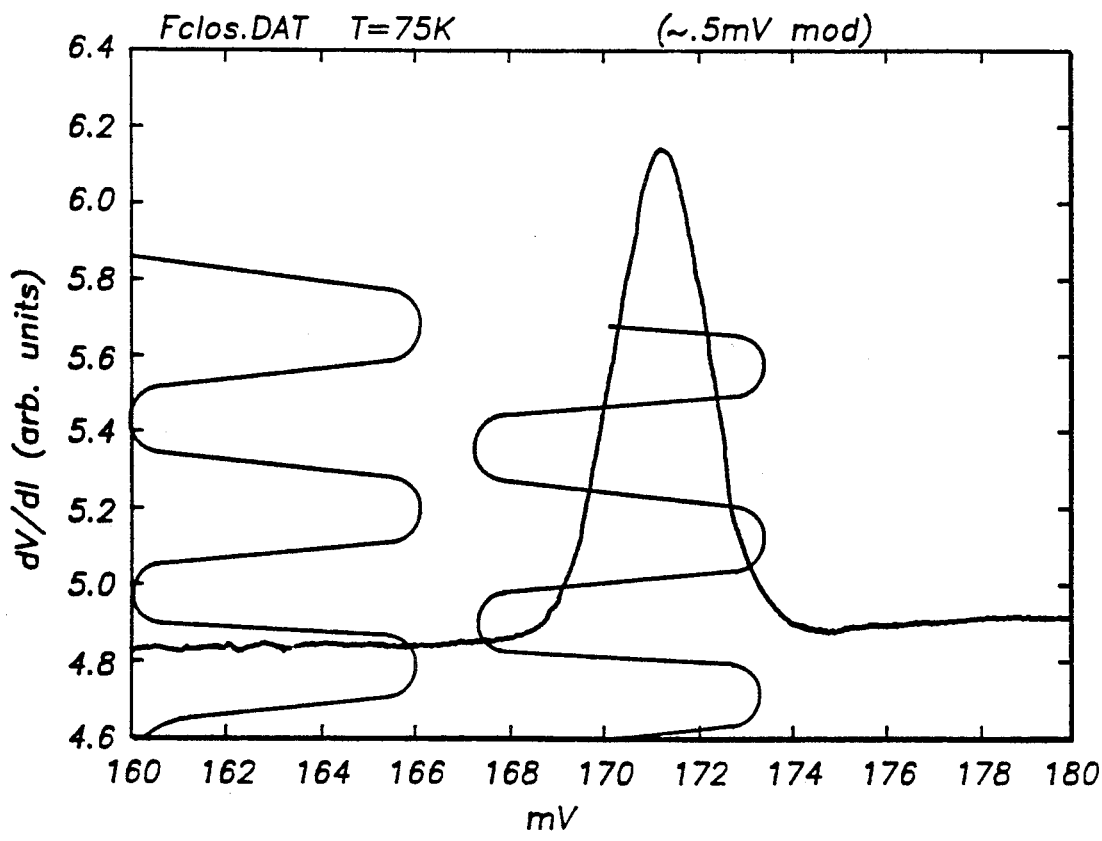
FIG.—5

SUPERCONDUCTOR-NORMAL-SUPERCONDUCTOR WITH DISTRIBUTED SHARVIN POINT CONTACTS

This invention was made with United States Government support under DOE Contract No. DE-FG03-86ER-45245. The Government has certain rights in this invention.

This is a continuation of application Ser. No. 07/732,049 filed Jul. 18, 1991, now abandoned.

This invention relates generally to non-linear junction devices, and more particularly to superconducting non-linear junction devices.

BACKGROUND OF THE INVENTION

Super-Schottky diodes and Josephson devices are electronic devices whose current-voltage response is highly non-linear. These have been used as radiation detectors and mixers for operation in the microwave, millimeter and higher frequency range. The conversion efficiency of these mixers is related to the degree of non-linearity of the current-voltage response. This non-linearity occurs over a small voltage range and becomes greater as the temperature becomes lower. The higher the non-linearity is, the higher is the efficiency of the mixer. Typically these devices must be cooled to liquid helium temperatures to improve their efficiency.

OBJECTS AND SUMMARY OF THE INVENTION

It is an object of this invention to provide an improved high-efficiency, non-linear junction device.

It is another object of this invention to provide an improved high-efficiency, non-linear superconducting junction device.

It is another object of this invention to provide a non-linear junction device which exhibits sharp resistance peaks which result from the destructive interference of super currents flowing through a normal metal layer.

It is another object of this invention to provide a high-efficiency, non-linear superconducting device suitable for use in superheterodyne mixers, low-noise detectors, infrared detectors, up-converters, and possibly other applications, such as, precision current and voltage sources.

The foregoing and other objects of this invention are achieved by a non-linear superconducting junction device including a layer of high temperature superconducting material, a thin layer of metal in metallic contact with the high temperature superconducting material, and which remains normal at the operating temperature of the device and a contact, including a layer selected so that it is superconducting at said operating temperature, making distributed Sharvin point contacts with said metal layer.

BRIEF DESCRIPTION OF THE DRAWINGS

The foregoing and other objects of the invention will be more clearly understood from the following description when read in connection with the accompanying drawings, of which:

FIG. 4 shows the resistance anomalies in the distributed non-linear superconducting junction device of this invention;

FIG. 5 shows a selected dV/dI peak (resistance peak) with an AC voltage applied to the junction at two different biases;

DESCRIPTION OF A PREFERRED EMBODIMENT

Figure 1:
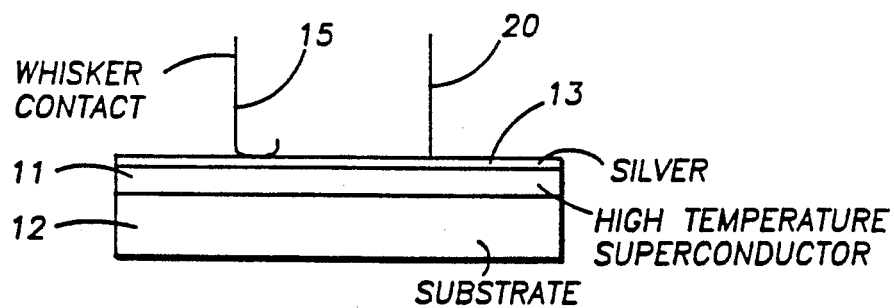
FIG. 1 shows a whisker contact forming the non-linear junction device in accordance with the invention.
Figure 2:
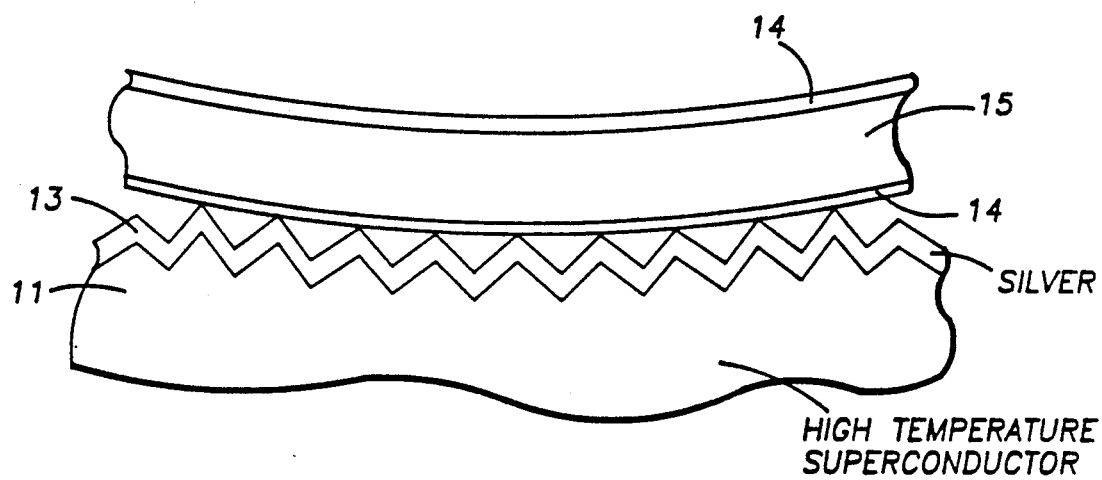
FIG. 2 is an enlarged view of the whisker contact making distributed Sharvin contacts with the rough metal layer.
Figure 3:
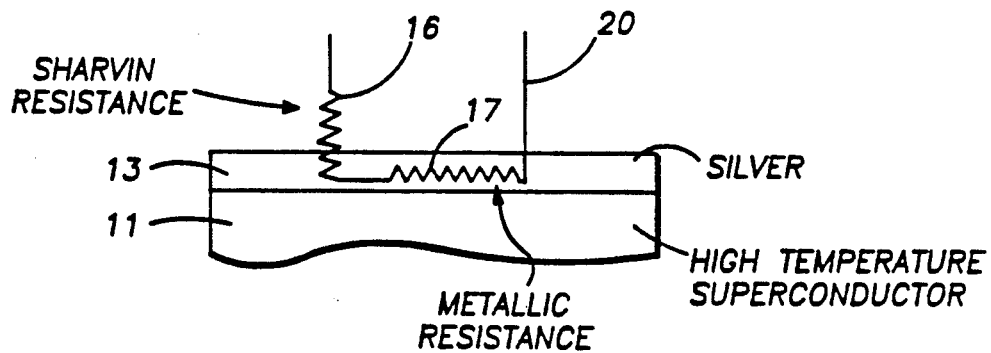
FIG. 3 schematically shows the linear resistances present in the device.

A distributed non-linear device in accordance with one embodiment of this invention is shown in FIGS. 1-3. The device includes a layer of high temperature superconductor material 11 formed by magnetron sputtering from a single stoichiometric target on a substrate 12. In one example, the high $T_c$ material was the $Tl_2Ba_2Ca_2Cu_3O_{10}$ (Tl-2223) compound. The film was quite rough, in a macroscopic sense, as shown in FIG. 2. The surface roughness was estimated to be in the order of 500 Å.

The surface of the sample was first sputter cleaned by argon ion bombardment to remove any native oxide on the surface, and then immediately covered with a layer of silver 13. This resulted in the formation of a clean silver/Tl-2223 interface. The best data to date has been obtained from superconducting films coated with approximately 2000 Å of silver, but samples have been prepared with silver thickness ranging from 500 Å to 2700 Å. A contact is made to the silver layer by so-called cat's whiskers 15, made from standard, off-the-shelf No. 32 gauge tinned copper wire coated with approximately 1000 Å of bismuth.

The rough surface provides an ideal surface with which to make distributed point contacts to the silver 13 as illustrated in FIG. 2 wherein the bismuth layer 14 makes point contact with the various ridges at the upper surface of the silver layer 13. The contacts are made by pressing the hooked No. 32 gauge, bismuth clad tinned copper wire 15 onto the surface of the silver. The resistance of the contact does not change significantly with temperature even when the sample becomes superconducting. This suggests that an array of Sharvin contacts [Yu. V. Sharvin, *Sov. Phys. JETP* 21,655 (1965)] had been established on the rough surface. It is noted that the silver thickness between the superconductor and the tip of each Sharvin contact is nearly equal. These contacts have a very small cross-sectional area relative to the mean free path of the electrons in the silver so the junction resistance is not temperature dependent.

An equivalent circuit for the device is shown in FIG. 3, wherein the temperature-independent resistance 16 of the Sharvin point contacts is shown connected through the metallic resistance 17 of the silver layer 13 to the second lead 20. In operation, the device is maintained at a temperature in which the high-temperature superconducting material forming layer 11 is superconducting.

We have discovered that at temperatures above the critical temperature of the superconductor, the junction behaves as a metallic junction resistance. That is, the differential resistance is independent of voltage to within the noise level of the measurements. An example of differential resistance versus voltage collected across a Bi/Ag/Tl-2223 interface at 77K is shown in FIG. 4. It is seen that the dV/dI has a smooth background structure that is periodically modulated by extremely sharp peaks 18. The background structure 19 can be related to Andreev reflection processes [A. F. Andreev, *Sov. Phys. JETP* 19, 1228 (1964)] at the Ag/Tl-2223 interface and has a structure similar to one that would be expected from BTK theory [G. E. Blonder, M. Tinkham and T. M. Klapwijk, *Phys. Rev.* B25, 4515 (1982)]. According to that theory, the resistance of a normal-to-superconductor (N/S) point contact should decrease when the voltage is less than the $\Delta/e$ of the superconductor due to the increased current resulting from the Andreev reflected electrons.

In the most general sense, the junction consists of two different metals, silver 13 and bismuth 14, in contact with a high-temperature superconductor 11. At some temperature below the critical temperature of the Tl-2223 compound, the bismuth tip becomes superconducting but the silver remains normal. In essence, the superconductivity develops on the other side of the normal silver layer 13 as a result of the free propagation of coherent particles through that layer. It is believed that this affects the current-voltage response of the junction because there is now a superconducting condensate on either side of the normal silver layer. It is believed that the peaks result from an interference of particles in the normal silver layer. These peaks are not only important from a practical viewpoint, but they give insight into the nature of the superconducting state in the high $T_c$ materials. The incredibly narrow width of the peaks leads one to reconsider the nature of the proximity effect. It is believed that the device of this invention is the first example of a proximity effect at a distance. That is, the bismuth is induced to be superconducting by the Tl-2223 superconductor through the normal silver layer. It is believed that the peaks represent a decrease in the super current flowing through the silver layer due to a destructive interference of the plane waves in that layer. Superconductivity is necessary on both sides of the silver layer for this interference effect to occur. The interference effect occurs only in the normal silver layer. If the silver becomes superconducting, then the super current will simply pass through the layer without this interference.

FIG. 4 is a plot showing the differential resistance dV/dI as the voltage across the junction device is increased. Note the sharp spikes 18 which represent increased resistance. These extremely sharp spikes, or non-linearities, are characteristic of a temperature at which the super-Schottky diodes and Josephson junctions are operating. However, these devices are operated at 80° K., which means that the non-linear devices of the present invention have the benefit of low-temperature efficiencies while operating at relatively high temperatures. It is anticipated that the device can be used up to frequencies which extend from the microwave region to the near infrared. This would allow coherent mixing and control of frequencies over a wide range of frequencies. The reason for this wide frequency domain is that the high temperature superconductors such as Tl-2223 which become superconducting at 122° K. have a superconducting gap in the excitation spectrum of their charge carriers which is comparable to infrared energies, and this guarantees an electromagnetic response that is relatively frequency independent over this range. In other words, the process we have observed in the present device should be able to follow the electromagnetic field with variations up to these extremely high frequencies.

The high degree of non-linearity in the resistance peak structure leads to the generation of harmonics at applied fundamental frequencies when a voltage sweeps through the peak.

Figure 6:
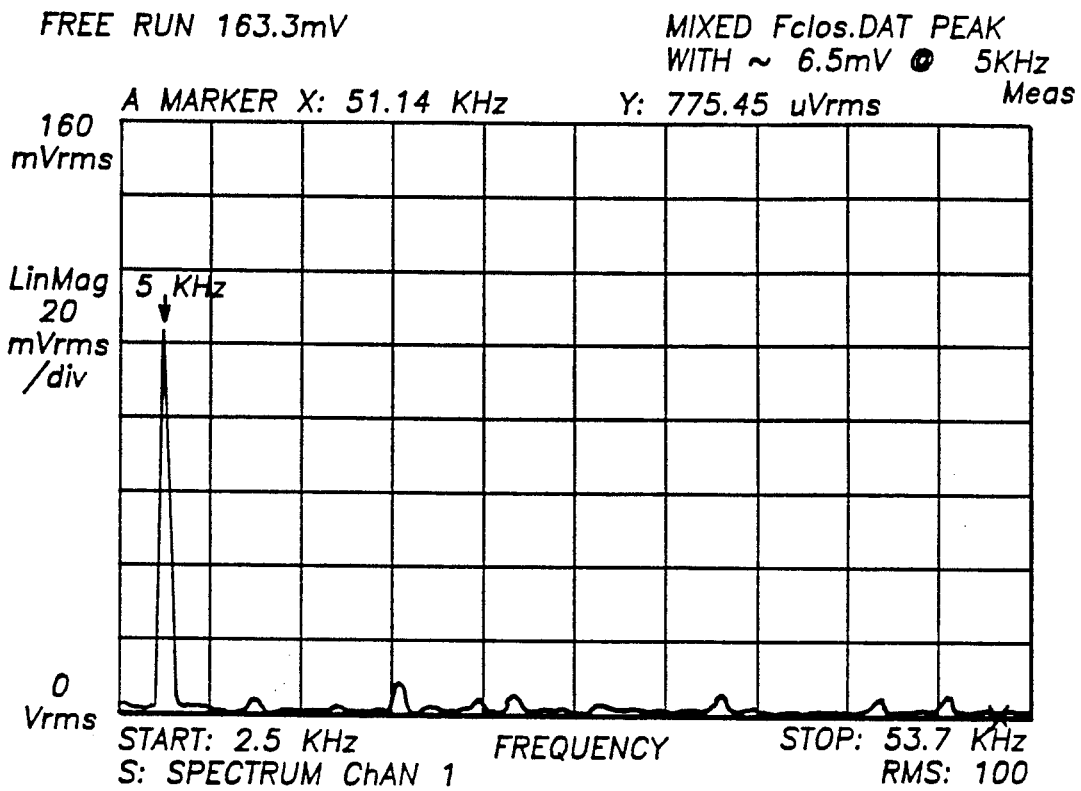
FIG. 6 shows the frequency spectrum of the junction output voltage for an AC voltage applied at lower DC bias voltage.
Figure 7:
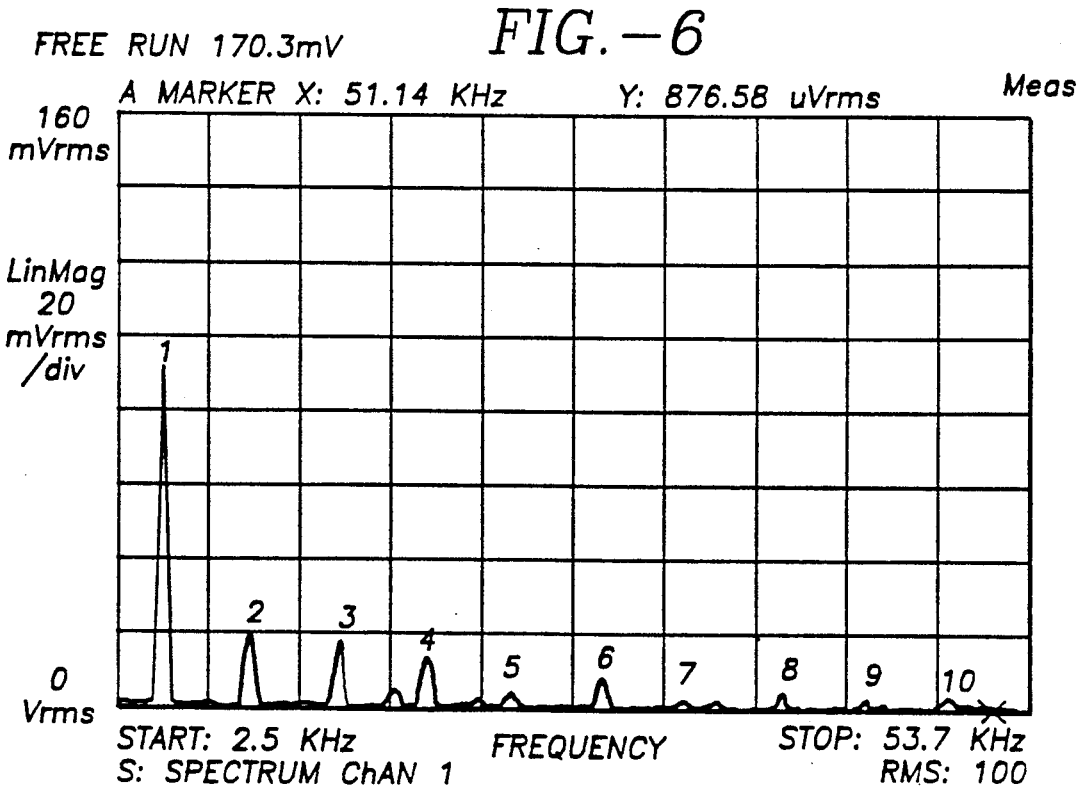
FIG. 7 shows the frequency spectrum of the junction output voltage for the same AC voltage applied at higher DC bias.

Referring to FIG. 5, there is illustrated an enlarged view of one of a peak such as one of the peaks shown in FIG. 4. There is shown a 6.5 $mV_{p-p}$, 5 kHz sine wave centered at 163.3 mV DC applied to the device. It is seen from this figure that the differential resistance is nearly linear a this voltage; hence, most of the output signal (FIG. 6) is centered at the fundamental frequency (5 Khz). By biasing the junction up to 170.3 mV, harmonics of the input frequency begin to be generated as the sine wave sweeps through the resistive peak, as shown in FIG. 7. Up to the tenth harmonic of the fundamental frequency is shown.

Other metals believed to be useful for the normal silver layer are metals that do not oxidize, have high conductivity and do not react with the superconductor layer. These are believed to be indium, gold and platinum. Metals other than bismuth are useful for the proximity effects layer. Tin and other metals which have a high conductivity and become superconducting by the proximity effect at the operating temperatures are suitable. The device will also work with a coating of superconducting material on the cat's whiskers making contact with the ridges of silver layer, thus forming a superconductor/normal/superconductor (S/N/S) junction which does not rely on the proximity effect or in any geometry in which the S/N/S structure can be achieved. Although there has been described a device constructed with Tl-2223, other high-temperature superconductor materials which operate at different critical temperatures can be used. Such other high critical temperature superconducting cuprate materials which can be used are:

| Compound | $T_c$ |
|---|---|
| $La_{2-x}Ba_xCuO_4$ | 30 K |
| $La_{2-x}Sr_xCuO_4$ | 40 K |
| $YBa_2Cu_3O_7$ | 95 K |
| $Bi_2Sr_2Ca_2Cu_3O_{10}$ | 105 K |
| $Nd_{2-x}Ce_xCuO_4$ | 24 K |
| $Tl_2Ba_2CaCu_2O_{8+x}$ | 108 K |
| $Tl_2Ba_2Ca_2Cu_3O_{10}$ | 125 K |

Thus, there has been provided a distributed point contact high $T_c$ superconducting junction device which is non-linear and has steep on-linearity so that when operated at the high superconducting temperatures still offer operation equivalent to operation at liquid helium temperature.

What is claimed:

1. A non-linear device operated at an operating temperature, said device comprising:
    a naturally superconducting material which has a critical temperature above said operating temperature;
    a normal metal layer which is in contact with said naturally superconducting material and which has a critical temperature below said operating temperature; and
    a second material which is superconducting at said operating temperature and which forms distributed point contacts with said metal layer, each distributed point contact having a small cross-sectional area relative to the mean free path of electrons in said metal layer.

2. A non-linear device as in claim 1 in which said second material comprises a metal which has a critical temperature below said operating temperature and becomes superconducting at said operating temperature via the proximity effect.

3. A non-linear device as in claim 1 in which said second material is a naturally superconducting material and has a critical temperature above said operating temperature.

4. A non-linear device as in claim 2 in which said second material is bismuth.

5. A non-linear device as in claim 2 in which said second material is tin.

6. A non-linear device as in claim 1 in which said naturally superconducting material is a high critical temperature superconducting material.

7. A non-linear device as in claim 1 in which said metal layer in contact with said naturally superconducting material has a rough surface with ridges and in whcih said distributed point contacts are formed with said ridges and said second material.

8. A non-linear device as in claim 1 in which said metal layer in metallic contact with said naturally superconducting material is silver.

9. A non-linear device as in claim 6 in which said high critical temperature superconducting material is $Tl_2Ba_2Ca_2Cu_3O_{10}$.

10. A non-linear device as in claim 6 in which said high critical temperature superconducting material is a high critical temperature superconducting cuprate material.

11. A non-linear device as in claim 6 in which said high critical temperature superconducting material has a critical temperature between approximately 30K and 125K.

* * * * *